(12) United States Patent
Somani et al.

(10) Patent No.: US 9,167,724 B1
(45) Date of Patent: *Oct. 20, 2015

(54) ALTERNATIVE DATA CENTER BUILDING DESIGNS

(71) Applicant: Google Inc., Mountain View, CA (US)

(72) Inventors: Ankit Somani, Sunnyvale, CA (US); Christopher Gregory Malone, Mountain View, CA (US)

(73) Assignee: Google Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/595,050

(22) Filed: Jan. 12, 2015

Related U.S. Application Data

(63) Continuation of application No. 13/683,171, filed on Nov. 21, 2012, now Pat. No. 8,931,221.

(51) Int. Cl.
*E04C 2/52* (2006.01)
*H05K 7/20* (2006.01)
*E04B 5/48* (2006.01)
*E04B 9/02* (2006.01)
*E04D 13/17* (2006.01)
*E04H 14/00* (2006.01)
*F24F 7/00* (2006.01)
*F24F 7/02* (2006.01)

(52) U.S. Cl.
CPC ............. *H05K 7/20709* (2013.01); *E04B 5/48* (2013.01); *E04B 9/02* (2013.01); *E04D 13/17* (2013.01); *E04H 14/00* (2013.01); *F24F 7/00* (2013.01); *F24F 7/02* (2013.01); *F24F 2007/003* (2013.01)

(58) Field of Classification Search
CPC ..... E04B 5/48; H05K 7/1497; H05K 7/20709
USPC .......... 52/220.1; 165/96; 361/679.46, 679.49, 361/679.5, 690, 692, 695; 454/184
See application file for complete search history.

(56) References Cited

U.S. PATENT DOCUMENTS

| 5,467,609 A | 11/1995 | Feeney |
| 6,374,627 B1 | 4/2002 | Schumacher et al. |
| 7,072,739 B2 | 7/2006 | Bash et al. |
| 7,856,838 B2 | 12/2010 | Hillis et al. |

(Continued)

FOREIGN PATENT DOCUMENTS

WO    WO-2011/146063 A1    11/2011

OTHER PUBLICATIONS

International Search Report & Written Opinion on PCT/US2013/070568 dated Feb. 27, 2014.

(Continued)

*Primary Examiner* — Chi Q Nguyen
(74) *Attorney, Agent, or Firm* — Edward A. Gordon; Foley & Lardner LLP

(57) ABSTRACT

A multi-floor data center, comprising in one implementation, a plurality of floors; a first set of server racks disposed about a first vertical center axis on each floor, the first set of server racks formed in a substantially closed shape, with a substantially vertical open center comprising a first airflow plenum at least for air flow; a first opening in each of the floors, with the first opening aligned with the substantially vertical first airflow plenum on it respective floor, wherein the substantially vertical first airflow plenums on the floors are aligned for communication through the first openings in the floors; outer wall; a roof with a roof opening therein.

20 Claims, 4 Drawing Sheets

(56) References Cited

U.S. PATENT DOCUMENTS

| | | |
|---|---|---|
| 7,878,889 B2 | 2/2011 | Day |
| 7,961,463 B2 | 6/2011 | Belady et al. |
| 7,971,446 B2 | 7/2011 | Clidaras et al. |
| 7,990,710 B2 | 8/2011 | Hellriegel et al. |
| 8,180,495 B1 | 5/2012 | Roy |
| 8,300,402 B2 | 10/2012 | Wei |
| 8,331,087 B2 | 12/2012 | Wei |
| 8,472,181 B2 | 6/2013 | Doll |
| 8,498,110 B2 | 7/2013 | Wei |
| 8,523,643 B1* | 9/2013 | Roy ................ 454/184 |
| 8,867,204 B1* | 10/2014 | Gardner ............ 361/679.46 |
| 8,931,221 B2* | 1/2015 | Somani et al. ........ 52/220.1 |
| 2008/0055850 A1 | 3/2008 | Carlson et al. |
| 2008/0305733 A1 | 12/2008 | Noteboom et al. |
| 2010/0126696 A1* | 5/2010 | Novotny et al. ........ 165/67 |
| 2011/0009047 A1 | 1/2011 | Noteboom et al. |
| 2011/0083824 A1 | 4/2011 | Rogers |
| 2011/0138708 A1 | 6/2011 | Chazelle et al. |
| 2011/0207391 A1 | 8/2011 | Hamburgen et al. |
| 2011/0220324 A1 | 9/2011 | Lindenstruth et al. |
| 2012/0009862 A1 | 1/2012 | Meyer |
| 2012/0012278 A1 | 1/2012 | Noteboom et al. |
| 2012/0075794 A1 | 3/2012 | Wei et al. |
| 2012/0103843 A1* | 5/2012 | Wei ................ 206/320 |

OTHER PUBLICATIONS

Miller, Rich. "Wild New Design: Data Center in a Silo." Data Center Knowledge RSS. Dec. 10, 2009. Web. May 15, 2013.
Miller, Rich. How Google Cools its Armada of Servers, Data Center Knowledge. Retrieved from internet on Nov. 20, 2012 at URL: http://www.datacenterknowledge.com/archives/2012/10/17/how-google-cools-its-armada-of-servers/ (7 pages).
US Notice of Allowance in U.S. Appl. No. 13/683,171 DTD Sep. 11, 2014.
US Office Action in U.S. Appl. No. 13/683,171 DTD Jan. 24, 2014.
US Office Action in U.S. Appl. No. 13/683,171 DTD Mar. 27, 2014.

* cited by examiner

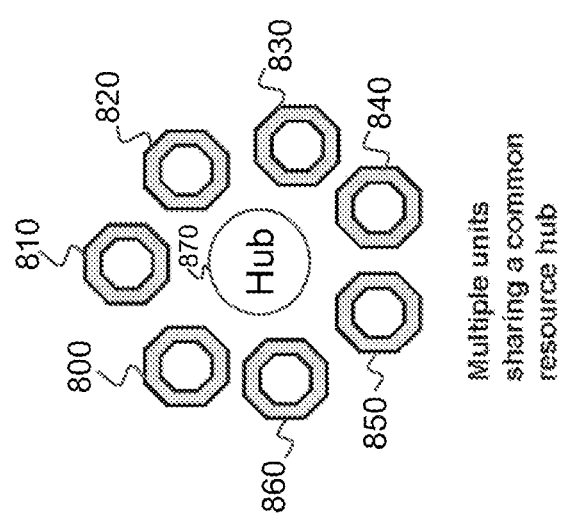

ALTERNATIVE DATA CENTER BUILDING DESIGNS

CROSS-REFERENCE TO RELATED PATENT APPLICATIONS

This application is a continuation application claiming priority to U.S. patent application Ser. No. 13/683,171, filed Nov. 21, 2012, issuing as U.S. Pat. No. 8,931,221 on Jan. 13, 2015, the entirety of which is incorporated herein by reference.

BACKGROUND

The present invention relates generally to the field of data center building design. More efficient building designs from a cooling standpoint and/or a space standpoint are needed for computer data center buildings.

SUMMARY

According to one aspect, a multi-floor data center includes a plurality of floors, a first set of server racks, a first opening in each of the floors of the data center above a first floor, an outer wall, and a first roof portion. The first set of server racks is disposed about a first vertical center axis on each floor. The first set of server racks on each floor is formed in a substantially closed shape, with a substantially vertical open center comprising a first airflow plenum. The first openings in each of the floors above a first one of the floors is aligned about the first vertical center axis to allow airflow between a portion of the first airflow plenum on one of the plurality of floors with a different portion of the first airflow plenum on an adjacent floor. The outer wall is disposed around and spaced from the first set of server racks, with the space between the first set of server racks and the outer wall comprising a second airflow plenum. The first roof portion is on a top one of the floors and has a first roof opening therein aligned with the first airflow plenum to allow fluid communication between the first airflow plenum and an external environment outside of the data center.

In some implementations, the data center includes a second opening in each of the plurality of floors. The second openings are aligned with the second airflow plenum to allow airflow between a first portion of the second airflow plenum on a floor with a second portion of the second airflow plenum on an adjacent floor.

According to another aspect, a data center includes a first set of server racks, a second set of server racks, an outer wall, and a roof. The first set of server racks is disposed on a first floor of the data center about a first vertical center axis and is formed in a first substantially closed shape, with a substantially vertical open center. The open center defines a first airflow plenum.

The second set of server racks is disposed about the first set of server racks and is formed in a second substantially closed shape. The second set of server racks substantially surrounds the first set of server racks and is spaced therefrom to form a substantially vertical second airflow plenum between the first set of server racks and the second set of server racks.

The outer wall is disposed around and spaced from the second set of server racks. The space between the second set of server racks and the outer wall defines a substantially vertical third airflow plenum. In some implementations, one or more openings in the outer wall and/or the first floor are configured to allow fluid communication with the external environment.

The room has a roof opening therein in airflow communication with the first airflow plenum to allow fluid communication between the first airflow plenum and an external environment outside the data center.

According to another aspect, a data center includes first, second, and third sets of server racks, a common hub, an outer wall, and a roof. The first set of server racks is disposed on a first floor about a first center axis. The first set of server racks is formed in a first substantially closed shape, with a substantially vertical open center. The open center defines an airflow plenum for the first set of server racks. The second set of server racks is disposed on the first floor about a second center axis. The second set of server racks is formed in a second substantially closed shape, with a substantially vertical open center. The open center defines an airflow plenum for the set of server racks. The third set of server racks is disposed on the first floor about a third center axis. The third set of server racks is formed in a third substantially closed shape, with a substantially vertical open center. The open center defines an airflow plenum for the third set of server racks.

The common hub is centered at a fourth center axis and is disposed substantially equidistant to the first, second and third sets of server racks. The common hub contains at least one of electrical conduits, a power transformer, a power generator, network infrastructure, and cooling infrastructure.

The outer wall is disposed around and spaced apart from the first, second, and third sets of server racks. The roof has one or more roof openings which providing airflow between the airflow plenums of the first, second, and third sets of server racks and an external environment outside of the data center. The data center may also have one or more openings in the outer wall and/or a data center floor to allow a second airflow with the external environment.

According to another aspect, a data center includes first and second sets of server racks, an outer wall, a roof, and a resource spine. The first set of server racks is disposed on a floor and is has at least a three-sided configuration or a single side forming a substantially continuous surface, extending around a central first airflow plenum having a vertical center axis. The first set of server racks has one open portion.

The second set of server racks is disposed on the floor having an least three-sided configuration or having a single side forming a substantially continuous surface. The second set of server racks has one open portion and is disposed substantially co-extensive with, and spaced apart from, the first set of server racks to form there between a substantially vertical second airflow plenum. The outer wall is disposed around, and spaced from, the second set of server racks. The space there between comprising a substantially vertical third airflow plenum.

The roof has a roof opening therein communicating with the substantially vertical first airflow plenum to allow fluid communication with an external environment outside the data center. The outer wall and/or the floor also include one or more openings to allow a second fluid communication between the third airflow plenum and the external environment.

The resource spine is disposed on the floor opposite the one open portion. The resource spine includes at least one of electrical conduits, a power transformer, a power generator, network infrastructure, and cooling infrastructure.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

BRIEF DESCRIPTION OF THE DRAWINGS

FIG. 8 is a top view of a fifth implementation of a data center building design using multiple of the first implementation building modules around a resource hub.

DETAILED DESCRIPTION

Figure 1A:
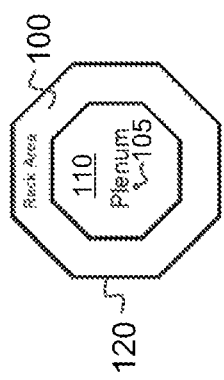
FIG. 1A is a top view of a first implementation of a data center building design.

Referring to FIG. 1A, a first implementation of a data center building design and server rack configuration is illustrated. FIG. 1A illustrates a top view of a building with one or more floors. A rack of server computers 100 is illustrated that forms a substantially continuously closed polygon with at least four sides with a substantially vertical open center comprising a first airflow plenum 110 at least for air flow. In some implementations, the number of sides may be 5, or 6, or 7, or 8, or a higher number. In some implementations, the outer wall of the building may also take the shape of a polygon. In some implementations, the outer wall may take a different shape.

In general a set of server racks is considered to have a closed surface if, from a plan view perspective, the outline of the set of server racks shares a common start and stopping point. Examples of closed shapes include circles, ellipses, polygons, as well as other shapes, regular or irregular, whose outlines completely enclose as space. The set of server racks may be substantially closed in that its plan outline may include a limited numbers of gaps or breaks through which personnel or various electrical or other conduits may pass or to allow the shifting of servers in or out of the racks, while maintaining a substantially closed shape.

Figure 1B:
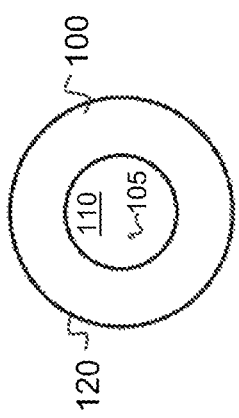
FIG. 1B is a top view of a second implementation of a data center building design.

Referring to FIG. 1B, a second implementation of a data center building design and server rack configuration is illustrated. FIG. 1B illustrates a top view of a building with one or more floors, with each floor in the shape of a cylinder or an oval or other continuous wall configuration. A rack of server computers 100 is illustrated that forms a substantially continuously closed cylindrical or oval or other continuous outer surface with a substantially vertical open center comprising a first airflow plenum 110. In some implementations, the outer wall of the building may also take the shape of a cylinder or oval. In some implementations, the outer wall may take a different shape.

In some implementations of the data centers shown in FIGS. 1A and 1B, the outer walls 120 of the data center building may be directly adjacent the outer surface of the server racks. In such implementations, air may be brought in from the ambient environment, which in some implementations may be external to the data center, via vents in the outer walls and/or false floor bottoms.

In some implementations, the outer wall 120 may be disposed around but spaced apart from server racks, with the space therebetween comprising a substantially vertical second airflow plenum (not shown).

In some implementations, the data center building may be fanless and may use natural convection. In some implementations, the data center building may include one or more fans disposed in or adjacent to one or both of the air plenums to create a negative pressure to assist air flow.

In some implementations, the data center building may be fanless and may use natural convection to turn a turbine for an electrical generator disposed in one of the airflow plenums, to thereby generate electrical energy for the data center.

The implementations described above may provide closer server-to-server (or storage or network box) proximity, thereby reducing the electrical path-length between the two furthest-apart pieces of IT equipment in the data center server racks. Such path-length reduction may result in improved data center performance. In addition, such configurations may provide for a shorter path from an interior air inlet to air outlet to the external environment, thereby reducing airflow resistance and increasing airflow. Such configurations may also result in shorter piping runs for network and electrical and network conduits as well as decreasing or eliminating the need for an external fan assist.

Some implementations of the implementations depicted in FIGS. 1A and 1B, may include bus duct segmentation to avoid or reduce electro-magnetic effects resulting from magnetic effects from closed ring-type electrical configurations. Additionally, power density on demand may be increased by adding more bus duct segments (initially, only partial deployment of bus ducts may be allowed) and/or by adding additional electrical taps from an electrical source. Electrical gear may be housed in the bottom floor.

Figure 2:
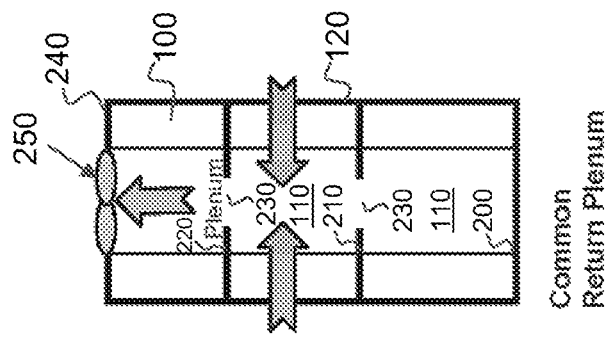
FIG. 2 is a cross-sectioned side view of the first and the second implementations of a multi-story data center building design.

FIG. 2 shows a cross-sectional side view of the first and the second data center configurations shown FIGS. 1A and 1B for a multi-story data center building design with three floors 200, 210, and 220. In some implementations, a first opening 230 may be formed in each of the floors 210 and 220 above a first one of the floors. The first opening 230 are substantially aligned with the first airflow plenum 110 on a respective floor such that the first airflow plenums 110 on the various floors are aligned to facilitate airflow through the first openings 230 in the floors. A roof 240 is provided with a roof opening 250 therein aligned with the first airflow plenum 110 on a top floor 220 of the three floors to allow a fluid communication with the external environment outside the data center.

A first set of server racks 100 is disposed about a first vertical center axis 105 on each floor. The first set of server racks 100 are formed having an outer surface in the shape of a substantially closed polygon, as shown in FIG. 1A. The outer surface has at least four sides. In some implementations, the number of sides may be 4, 5, or 6, or 7, or 8, or a higher number. In some implementations, the first set of server racks 100 may be disposed about a first vertical center axis 105 on each floor and formed with a single side or surface forming a substantially continuous closed surface as illustrated in FIG. 1B. The set of server racks 100 has a substantially vertical open center defining the first airflow plenum 110. In some implementations, a first opening 230 may be formed in each of the floors above a first one of the floors. The first openings 230 are aligned with the first airflow plenum 110 on the respective floors, and the vertical first airflow plenums 110 on the floors are also aligned for communication through the first openings 230 in the floors. In some implementations, an outer wall or outer walls may be disposed around but spaced apart from the first set of server racks, with the space therebetween defining a substantially vertical second airflow plenum. In some implementations, a roof 240 with a roof opening 250 therein communicating with the substantially vertical first airflow plenum 110 of the first set of server racks on a top one of the floors to allow a first fluid communication with the external environment outside the data center. In some implementations, a fan may be disposed in the first airflow plenum to assist communication with the external environment. In some implementations, the fan may be disposed in the opening 250 in the roof to assist communication with the ambient environment. In some implementations, relevant electrical/mechanical gear, such as coolant pumps, fans, transformers, and or back-up power supplies, for supporting the servers may be conveniently placed in the bottom level 200 in FIG. 2. This placement promotes efficient use of space.

In some implementations, a second one or more openings may be formed in each of the floors. The second one or more openings are aligned with the substantially vertical second airflow plenum on the respective floors. In addition, the substantially vertical second airflow plenums on the floors are aligned for communication through the second one or more openings in the floors.

Figure 3:
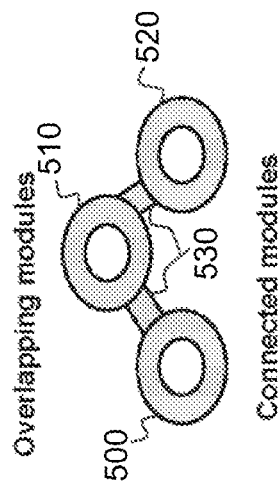
FIG. 3 is a cross-sectioned perspective side view of a multi-story tapered implementation of a data center building design.

Referring to FIG. 3, implementations are illustrated of a polygonal or continuous closed surface outer wall 340 tapered upwardly so that the size of the horizontal cross-section thereof decreases continuously or in stages as its height from the base increases. In some implementations, the server racks may also have exterior surfaces that are polygonal or that from a continuous or substantially continuous closed surface, and may be set back from the outer wall 340. In some implementations, each of the floors 300, 310, and 320 may have server rack configurations as described previously.

Figure 4:
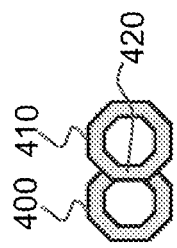
FIG. 4 is a top view of the first implementation of a data center building design with overlapping building modules.

The design of FIG. 4 illustrates overlapping polygonal or continuous wall configurations and overlapping server rack configurations. The outer wall can have, but is not limited to a polygon or continuous wall configuration.

Referring to FIG. 4, a top view a data center building design with overlapping building modules 400 and 410 is shown. In some implementations, each of the building modules may take the design of the polygon of FIG. 1A. In some implementations, the modules 400 and 410 may just share a passageway to have better modularity for building out the systems housed therein without compromising on human, electrical, network, or other types of connectivity between the modules. In some implementations, the modules 400 and 410 may share one or more server racks 420 in the shared side of the polygon. In some implementations, the overlapping building modules may take the form of the building module of FIG. 1B, with the modules being cylindrical, or oval, or another continuous wall shape. In some implementations, the overlapping building modules may have multiple floors which may be connected to each other. Thus, better modularity may be achieved for building out systems without compromising connectivity. Note that in some implementations, the data center shown in FIG. 4 may have multiple floors which may be connected with each other.

Figure 5:
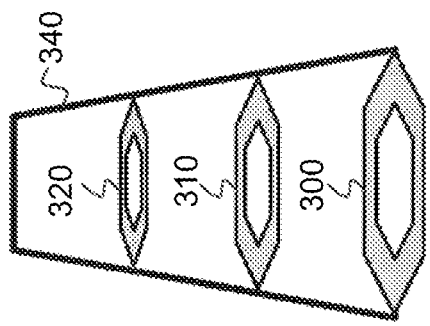
FIG. 5 is a top view of the second implementation of a data center building design with connected building modules.

FIG. 5 shows a top view of a second implementation of a data center building design with connected building modules 500, 510 and 520. In such implementations, the building modules may be connected with building connections 530. The building connections 530 may house server racks, and/or conduit channels, and/or air plenums, and/or simply walkways. The data center in FIG. 5 includes a set of server racks. In some implementations, the outer wall surrounding the server racks may take the same polygonal or continuous wall configuration as the server racks therein. In some implementations, the outer wall may take other configurations. These connected configurations may have multiple floors, which in some implementations may be connected laterally to each other on some or all of the floors.

Figure 6:
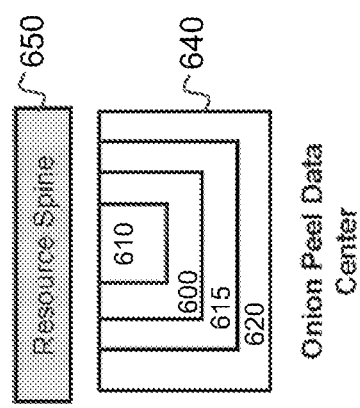
FIG. 6 is a top view of a third implementation of a data center building design using a modified onion peel design and a resource spine.

Referring to FIG. 6, a top view of a third implementation of a data center building design using a modified onion peel design and a resource spine is illustrated. The data center includes a first set of server racks 600 that may be disposed on a floor and formed in the shape of at least a three-sided configuration or with a single side forming a substantially continuous surface, extending around a central first airflow plenum 610, but with one open portion.

In some implementations, a second set of server racks 620 may be disposed on the floor and formed in the shape of at least a three-sided configuration or with a single side forming a substantially continuous surface, with one open portion, wherein the second set of server racks 620 is disposed substantially co-extensive with the first set of server racks 600 but spaced therefrom to form therebetween a substantially vertical second airflow plenum 615. In some implementations, the second set of server racks 620 may be directly adjacent an outer wall 640 of the data center. In some implementations, the second set of server racks 620 may be spaced from the outer wall 640, with the space therebetween comprising a substantially vertical third airflow plenum (not shown).

In some implementations, a roof (not shown) is provided with a roof opening therein communicating with the substantially vertical first airflow plenum 610 to allow fluid communication with the external environment outside the data center.

In some implementations, one or more openings or vents may be formed in the outer wall 640 and/or the floor to allow second fluid communication of the second set of server racks with the external environment.

In some implementations, a resource spine 650 may be disposed on the floor opposite the open portion of the one and second set of server racks 600 and 620. In some implementations, the resource spine 650 includes electrical conduits, a power transformer, a power generator, network infrastructure, and/or cooling infrastructure.

Figure 7:
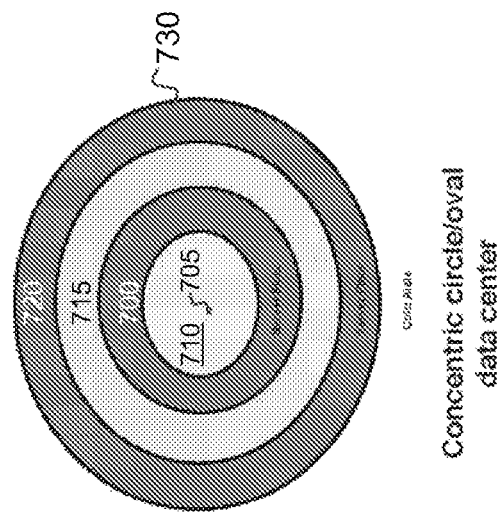
FIG. 7 is a top view of a fourth implementation of a data center building design using concentric circles or polygons.

Referring to FIG. 7, implementations of a data center are illustrated that include multiple concentric rings, ovals or polygons of server racks, with the server rack polygons, rings, or ovals separated by airflow plenums. In some implementations, a first set of server racks 700 may be disposed about a first vertical center axis 705 on a floor and formed in the shape of a substantially closed polygon with at least four sides, or with a single side forming a substantially continuous closed surface such as a cylinder or oval or other closed shape, with a substantially vertical open center which forms a first airflow plenum 710.

A second set of server racks 720 is disposed around the first vertical center axis 705 on the floor and formed in the shape of a substantially closed polygon with at least four sides or with a single side forming a substantially continuous closed surface such as a cylinder or oval or other closed shape. The second set of server racks 720 forms a substantially closed surface around the first set of server racks 700, but is spaced therefrom to form a substantially vertical second airflow plenum 715 between the first set of server racks 700 and the second set of server racks 720.

An outer wall 730 may be disposed around the second set of server racks 720. In some implementations, air vents may be disposed in the outer walls to provide air flow communication with the external environment outside the data center. In some implementations, the outer wall 730 may be spaced from the second set of server racks 720. The space between the second set of server racks 720 and the outer wall 730 defines a substantially vertical third airflow plenum (not shown).

A roof (not shown in the figure) with a roof opening therein permits airflow between the substantially vertical first airflow plenum 710 within the first set of server racks and the external environment.

In some implementations, one or more openings may be formed in the floor in alignment with the third airflow plenum, to allow airflow with a communications passage leading to the external environment.

In some implementations, a multi-story data center may be formed, with each of the floors taking the configuration of the concentric polygons or rings or other shapes, as shown in FIG. 7.

Referring to FIG. 8, implementations of a data center are illustrated that include at least four sets of server racks, with the server racks taking the configuration of either FIG. 1A or FIG. 1B. FIG. 8 illustrates seven sets of server racks 800, 810, 820, 830, 840, 850, and 860, disposed about a resource hub 870. In some implementations, the server racks 800-860 may be disposed symmetrically about the resource hub with the resource hub 870 in the center. In some implementations, the server racks 800-860 may be disposed asymmetrically about the resource hub 870.

In one implementation, each of the sets of server racks 800, 810, 820, 830, 840 and 850 is disposed about a respective center axis. Each is also formed in the shape of a substantially closed polygon with at least four sides or with a single side forming a substantially continuous closed surface and have a substantially vertical open center. The open centers of the sets of server racks 800, 810, 820, 830, 840 and 850 define respective air flow plenum for the sets of server racks.

The common hub 870 is centered at a fourth center axis. In some implementations, the common hub 870 is substantially equidistant from the sets of server racks. The common hub contains electrical conduits, a power transformer, a power generator, network infrastructure, and/or cooling infrastructure.

In some implementations, the data center has multiple floors. Each of the floors has its own sets of server racks arranged similarly to the sets of server racks 800, 810, 820, 830, 840 and 850, described above. The sets of server racks on the other floors, in some implementations are positioned to be aligned with the sets of server racks 800, 810, 820, 830, 840 and 850.

The server racks may house one or more servers, multi-processor systems, minicomputers, mainframe computers, network communications devices, and other devices.

All components, modes of communication, and/or processes described heretofore are interchangeable and combinable with similar components, modes of communication, and/or processes disclosed elsewhere in the specification, unless an express indication is made to the contrary. It is intended that any structure or step of an implementation disclosed herein may be combined with other structure and or method implementations to form further implementations with this added element or step.

While this invention has been described in conjunction with the exemplary implementations outlined above, it is evident that many alternatives, modifications and variations will be apparent to those skilled in the art. Accordingly, the exemplary implementations of the invention, as set forth above, are intended to be illustrative, not limiting. Various changes may be made without departing from the spirit and scope of the invention.

We claim:

1. A data center comprising:
a first set of server racks disposed on a first floor about a first center axis, the first set of server racks formed in a first substantially closed shape, with a substantially vertical open center comprising an airflow plenum for the first set of server racks;
a second set of server racks disposed on the first floor about a second center axis, the second set of server racks formed in a second substantially closed shape, with a substantially vertical open center comprising an airflow plenum for the second set of server racks;
a third set of server racks disposed on the first floor about a third center axis formed in a third substantially closed shape, with a substantially vertical open center comprising an airflow plenum for the third set of server racks;
a common hub centered at a fourth center axis, the common hub containing at least one of an electrical conduit, a power transformer, a power generator, network infrastructure, and cooling infrastructure;
an outer wall disposed around and spaced apart from the first, second, and third sets of server racks;
a roof portion with at least one roof opening therein providing airflow between the airflow plenums of the first, second, and third sets of server racks and an external environment outside of the data center; and
at least one opening in the outer wall or a data center floor to allow a second airflow with the external environment.

2. The data center of claim 1, wherein at least one of the first, second, and third substantially closed shapes comprises a substantially closed polygon with at least four sides.

3. The data center of claim 1, wherein at least one of the first, second, and third substantially closed shapes comprises a shape having single side forming a substantially continuous closed surface.

4. The data center of claim 1, comprising a second floor, wherein fourth, fifth, and sixth sets of server racks are disposed on the second floor in the same configuration as, and substantially directly above, the first, second, third sets of server racks, respectively, on the first floor.

5. The data center of claim 1, wherein the common hub is disposed substantially equidistant to the first, second and third sets of server racks.

6. The data center of claim 1, wherein the first, second and third sets of server racks are disposed symmetrically about the common hub.

7. The data center of claim 1, wherein the first, second and third sets of server racks are disposed asymmetrically about the common hub.

8. The data center of claim 1, wherein the first, second and third sets of server racks each house devices, wherein the devices are each one of: a server, a multi-processor system, a minicomputer, a mainframe computer, or a network communications device.

9. The data center of claim 8, wherein at least one of the devices is configured to use a resource provided by the common hub.

10. The data center of claim 1, further comprising a fan disposed in or adjacent to at least one of the airflow plenums, the fan assisting air flow therein.

11. A data center comprising:
a common resource hub;

a first plurality of server racks disposed on a first floor and arranged into multiple sets of server racks each set of server racks forming a substantially closed shape with a substantially vertical open center defining an airflow plenum for the respective set of server racks, and wherein the sets of server racks are distributed around the common resource hub;

a roof portion with roof openings therein providing airflow between the airflow plenums for the respective sets of server racks and an environment external to the data center; and an outer wall disposed around the sets of server racks, the outer wall spaced apart from the sets of server racks to form an outer airflow plenum, wherein at least one of a lowest floor of the data center and the outer wall has at least one opening providing airflow between the outer airflow plenum and the environment external to the data center.

12. The data center of claim 11, wherein the substantially closed shape formed by at least one set of server racks in the multiple sets of server racks comprises a substantially closed polygon with at least four sides.

13. The data center of claim 11, wherein the substantially closed shape formed by at least one set of server racks in the multiple sets of server racks comprises a shape having a single side forming a substantially continuous closed surface.

14. The data center of claim 11, comprising a second plurality of server racks disposed on a second floor and arranged into multiple sets of server racks each positioned substantially directly above a corresponding set of server racks on the first floor.

15. The data center of claim 11, wherein the common hub is disposed substantially equidistant to each of the multiple sets of server racks.

16. The data center of claim 11, wherein the multiple sets of server racks are disposed symmetrically about the common hub.

17. The data center of claim 11, wherein the common resource hub comprises at least one of an electrical conduit, a power transformer, a power generator, network infrastructure, and cooling infrastructure.

18. The data center of claim 11, wherein the server racks each house devices, wherein the devices are each one of: a server, a multi-processor system, a minicomputer, a mainframe computer, or a network communications device.

19. The data center of claim 18, wherein at least one of the devices is configured to use a resource provided by the common hub.

20. The data center of claim 11, further comprising a fan disposed in or adjacent to at least one of the airflow plenums, the fan assisting air flow therein.

* * * * *